United States Patent
Nanzawa (10) Patent No.: US 11,907,579 B2
(45) Date of Patent: Feb. 20, 2024

(54) MEMORY SYSTEM

(71) Applicant: KIOXIA CORPORATION, Tokyo (JP)

(72) Inventor: Hidekazu Nanzawa, Sagamihara Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/590,322

(22) Filed: Feb. 1, 2022

(65) Prior Publication Data
US 2023/0088028 A1 Mar. 23, 2023

(30) Foreign Application Priority Data
Sep. 21, 2021 (JP) .................. 2021-153210

(51) Int. Cl.
G06F 3/06 (2006.01)
G06F 11/34 (2006.01)
G06F 12/0882 (2016.01)

(52) U.S. Cl.
CPC ............ G06F 3/0659 (2013.01); G06F 3/064 (2013.01); G06F 3/0613 (2013.01); G06F 3/0679 (2013.01); G06F 11/3466 (2013.01); G06F 12/0882 (2013.01)

(58) Field of Classification Search
CPC ...... G06F 3/0659; G06F 3/0613; G06F 3/064; G06F 3/0679; G06F 11/3466; G06F 12/0882; G06F 12/0246; G06F 2212/1004; G06F 2212/1016; G06F 2212/1044; G06F 2212/7202; G06F 2212/7204; G06F 2212/7206; G06F 3/061; G06F 3/0634; G06F 3/068; G11C 11/5671; G11C 16/10; G11C 16/26; G11C 29/023; G11C 29/08; G11C 16/0483; G11C 29/56012; G11C 2211/5641; Y02D 10/00
USPC .......................................... 711/154
See application file for complete search history.

(56) References Cited

U.S. PATENT DOCUMENTS

2008/0250220 A1 10/2008 Ito
2012/0287736 A1* 11/2012 Cheng .................. G11C 11/419
365/194
2014/0281226 A1 9/2014 Kato et al.
2016/0313928 A1* 10/2016 Chun .................... G06F 3/0659
(Continued)

FOREIGN PATENT DOCUMENTS

JP 2008276733 A 11/2008
JP 2014021763 A 2/2014

*Primary Examiner* — Hua J Song
(74) *Attorney, Agent, or Firm* — Kim & Stewart LLP (57) ABSTRACT

A memory system includes a non-volatile memory and a memory controller. The non-volatile memory includes a memory cell array having pages. The memory system is configured to execute a first operation method and a second operation method. The memory system includes a control information storage unit in which a first value is set for pages having a write operation speed that is slower than a first speed, and a second value is set for pages having a write operation speed that is equal to or higher than the first speed. The memory system is configured to, at the time of write operation, select the first operation method for a target page having the first value and perform the write operation using the first operation method, and select the second operation method for a target page having the second value and perform the write operation using the second operation method.

18 Claims, 6 Drawing Sheets

(56) References Cited

U.S. PATENT DOCUMENTS

2017/0123707 A1* 5/2017 Carey ................. G06F 13/4282
2019/0087102 A1   3/2019 Yu et al.
2022/0164123 A1* 5/2022 Kim ..................... G06F 3/0659

* cited by examiner

| INDEX | Index0 (P0) | Index1 (P1) | Index2 (P2) | . . . | Index(n-1) (Pn-1) | Indexn (Pn) |
|---|---|---|---|---|---|---|
| ELEMENT | 11 | 11 | 01 | . . . | 00 | 11 |

MEMORY SYSTEM

CROSS-REFERENCE TO RELATED APPLICATION

This application is based upon and claims the benefit of priority from Japanese Patent Application No. 2021-153210, filed Sep. 21, 2021, the entire contents of which are incorporated herein by reference.

FIELD

Embodiments described herein relate generally to a memory system.

BACKGROUND

A memory system including a non-volatile memory as a semiconductor storage device and a memory controller for controlling the semiconductor storage device is known.

DETAILED DESCRIPTION

Embodiments provide a memory system that reduces variations in operating performance, enables high storage capacity, and facilitates achievement of required performance indices.

In general, according to one embodiment, a memory system includes a non-volatile memory and a memory controller. The non-volatile memory includes a memory cell array having pages. The memory system is configured to be able to execute a first operation method and a second operation method. The memory system includes a control information storage unit in which a first value is set for pages having a write operation speed that is slower than a first speed, and a second value is set for pages having a write operation speed that is equal to or higher than the first speed. The memory system is configured to, at the time of write operation, select the first operation method for a target page having the first value and perform the write operation using the first operation method, and select the second operation method for a target page having the second value and perform the write operation using the second operation method.

Hereinafter, embodiments for carrying out the present disclosure will be described with reference to the drawings.

(First Embodiment) A memory system according to the first embodiment will be described below.

Figure 1:
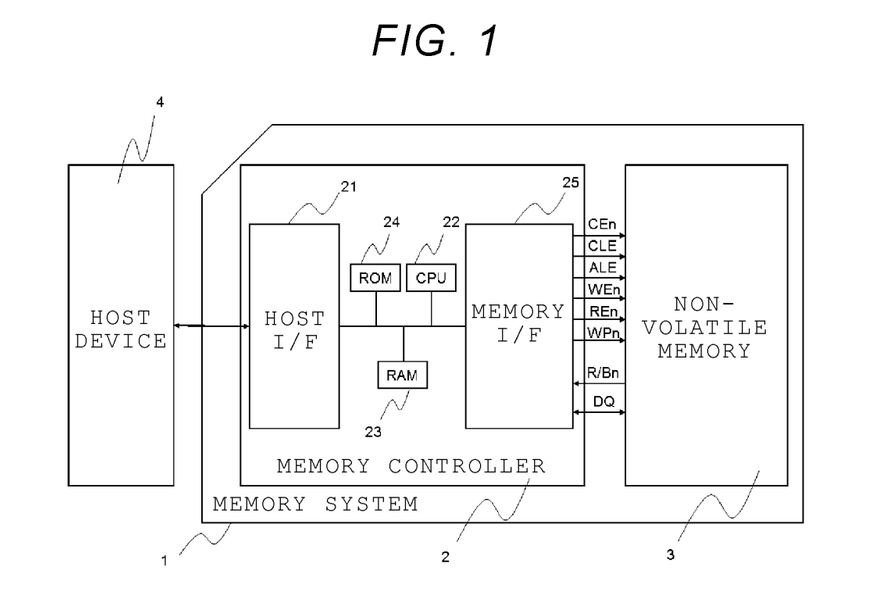
FIG. 1 is a block diagram for illustrating a configuration of a memory system according to a first embodiment.
Figure 2:
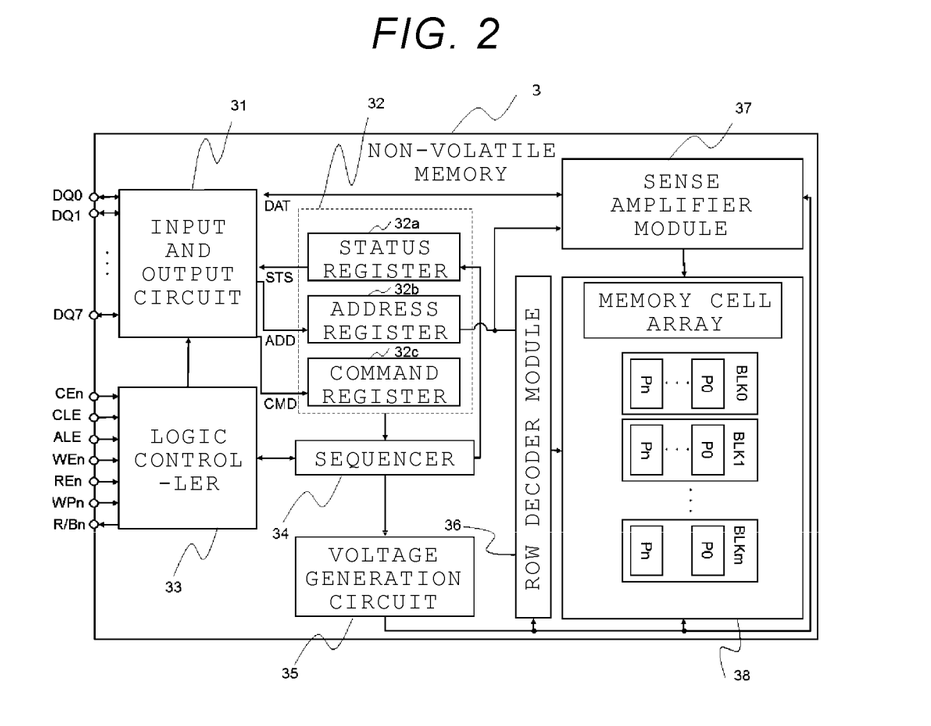
FIG. 2 is a block diagram for illustrating a configuration of a non-volatile memory according to the first embodiment.
Figure 3:
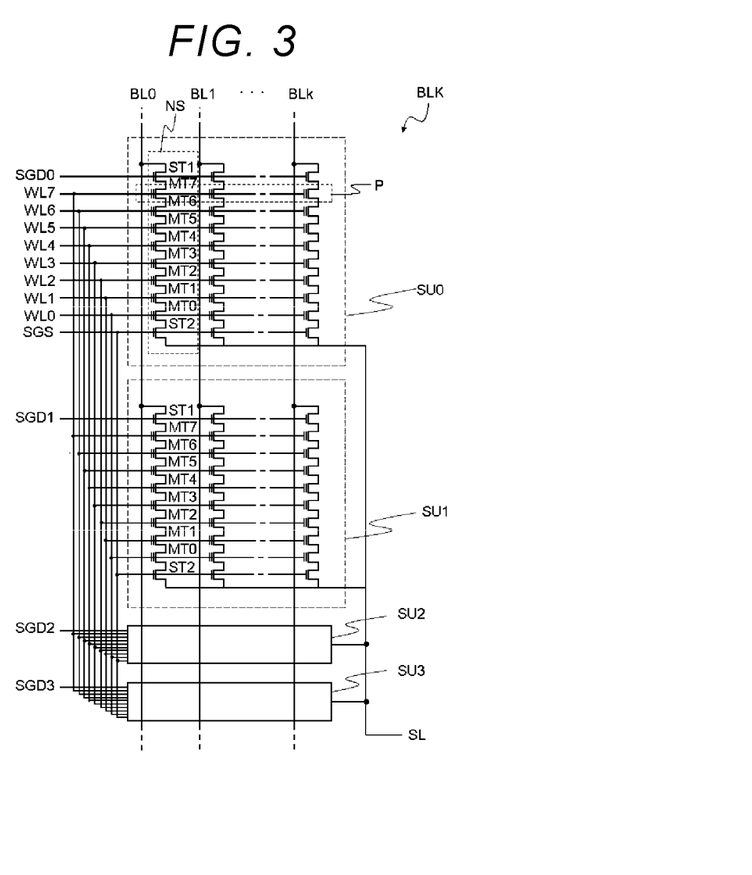
FIG. 3 is a circuit diagram for illustrating a configuration of a memory cell array according to the first embodiment.

(Configuration) The configuration of a memory system 1 of the first embodiment will be described with reference to FIGS. 1 to 3. FIG. 1 is a block diagram for illustrating the configuration of the memory system according to the first embodiment, and FIG. 2 is a block diagram for illustrating the configuration of a non-volatile memory according to the first embodiment. FIG. 3 is a circuit diagram for illustrating the configuration of a memory cell array according to the first embodiment.

As shown in FIG. 1, the memory system 1 includes a non-volatile memory 3 and a memory controller 2, and is controlled by a host device 4. The memory system 1 is, for example, an SD® card or an SSD (Solid State Drive).

The non-volatile memory 3 is controlled by the memory controller 2. The memory controller 2 receives a command from the host device 4 and controls the non-volatile memory 3 based on the received command. For example, the memory controller 2 performs a write operation and a read operation on the non-volatile memory 3. Further, the non-volatile memory 3 can store, for example, a management table described later. In the present embodiment, the non-volatile memory 3 will be described as an example of the control information storage unit. The non-volatile memory 3 is, for example, a NAND flash memory (NAND) capable of storing data non-volatilely.

The memory controller 2 includes a host I/F circuit (host interface circuit) 21, a CPU (central processing unit) 22, a RAM (random access memory) 23, a ROM (read only memory) 24, and a memory I/F circuit (memory interface circuit) 25. In the present embodiment, the CPU 22 is an example of a second control circuit. Further, in the present embodiment, the non-volatile memory 3 will be described as an example of the control information storage unit, but the RAM 23 and the ROM 24 may be the control information storage unit, and the control information storage unit is not limited thereto. The memory controller 2 is configured as, for example, a SoC (System-on-a-chip).

The ROM 24 stores firmware (program). The RAM 23 can hold the firmware read from the non-volatile memory 3 and the ROM 24, and is used as a work area of the CPU 22. The RAM 23 further temporarily stores the data received from the host device 4 and the data read from the non-volatile memory 3 and functions as a buffer and a cache. The firmware read from the non-volatile memory 3 and the ROM 24 onto the RAM 23 is executed by the CPU 22. As a result, the memory controller 2 executes numerous operations including a write operation and a read operation described later, and a part of the functions of the host interface circuit 21 and the memory interface circuit 25.

The host interface circuit 21 is connected to the host device 4 via a host bus and controls communication between the memory controller 2 and the host device 4. The host bus is, for example, a bus conforming to the SD standard. The memory interface circuit 25 is connected to the non-volatile memory 3 via a memory bus, and transmits and receives signals between the memory controller 2 and the non-volatile memory 3. The memory bus is, for example, a bus that transmits and receives signals conforming to a NAND interface. The signals conforming to the NAND interface include, for example, control signals including a chip enable signal CEn, a command latch enable signal CLE, an address latch enable signal ALE, a write enable signal WEn, a read enable signal REn, a write protect signal WPn, and a ready and busy signal R/Bn, and a signal DQ.

As shown in FIG. 2, the non-volatile memory 3 includes an input and output circuit 31, a register set 32, a logic controller 33, a sequencer 34, a voltage generation circuit 35, a row decoder module 36, a sense amplifier module 37, and a memory cell array 38. In the present embodiment, the sequencer 34 is an example of a first control circuit.

The input and output circuit 31 transmits and receives the signal DQ to and from the memory controller 2. For example, when the signal DQ has an 8-bit width, the signals DQ0 to DQ7 are transmitted and received to and from the memory controller 2. The signal DQ may include data DAT, status STS, address ADD, command CMD, and the like. Further, the input and output circuit 31 transmits and receives the data DAT to and from the sense amplifier module 37.

The register set 32 includes a status register 32a, an address register 32b, and a command register 32c. The status register 32a, the address register 32b, and the command register 32c store the status STS, the address ADD, and the command CMD, respectively.

The status STS is transmitted from the status register 32a to the input and output circuit 31 based on the instruction from the memory controller 2 and is output to the memory controller 2. Further, the status STS stored in the status register 32a is updated by the sequencer based on, for example, the operation state of the sequencer 34. The address ADD is transmitted from the input and output circuit 31 to the address register 32b. The address ADD may include, for example, a chip address, a block address, a page address, a column address, and the like. The command CMD is transmitted from the input and output circuit 31 to the command register 32c. The command CMD includes commands related to various operations of the non-volatile memory 3.

The logic controller 33 controls each of the input and output circuit 31 and the sequencer 34 based on the control signal received from the memory controller 2 via the memory bus. As such control signals, for example, a chip enable signal CEn, a command latch enable signal CLE, an address latch enable signal ALE, a write enable signal WEn, a read enable signal REn, and a write protect signal WPn are used. Further, the logic controller 33 notifies the memory controller 2 of the control signal received from the sequencer 34. As such a control signal, for example, a ready and busy signal R/Bn is used.

The chip enable signal CEn is a signal for enabling the non-volatile memory 3. The command latch enable signal CLE is a signal for notifying the input and output circuit 31 that the received signal DQ is a command CMD. The address latch enable signal ALE is a signal for notifying the input and output circuit 31 that the signal DQ is an address ADD. The write enable signal WEn is a signal for instructing the input and output circuit 31 to input the signal DQ. The read enable signal REn is a signal for instructing the input and output circuit 31 to output the signal DQ. The write protect signal WPn is a signal for putting the non-volatile memory 3 in a protected state when the power is turned on and off. The ready and busy signal R/Bn is a signal for notifying the memory controller 2 whether the non-volatile memory 3 is in the ready state or the busy state. In the present specification, the "ready state" indicates that the non-volatile memory 3 is in a state capable of accepting a command from the memory controller 2, and the "busy state" indicates that the non-volatile memory 3 is in a state of not capable of accepting a command from the memory controller 2.

The sequencer 34 controls the operation of the entire non-volatile memory 3 based on the command CMD stored in the command register 32c. For example, the sequencer 34 controls the sense amplifier module 37, the row decoder module 36, the voltage generation circuit 35, and the like to execute various operations such as a write operation and a read operation.

The voltage generation circuit 35 generates a voltage based on the control by the sequencer 34 and supplies the generated voltage to the row decoder module 36, the sense amplifier module 37, the memory cell array 38, and the like. For example, the voltage generation circuit 35 generates a voltage to be applied to the word line WL, the bit line BL, and the source line SL by operations such as reading and writing. The voltage generation circuit 35 supplies the generated voltage to be applied to the word line WL to the row decoder module 36. The voltage generation circuit 35 supplies the generated voltage to be applied to the bit line BL to the sense amplifier module 37. The voltage generation circuit 35 supplies the generated voltage to be applied to the source line SL to the source line SL in the memory cell array 38.

The row decoder module 36 receives the row address from the address register 32b and decodes the received row address. Based on the result of the decoding, the row decoder module 36 selects a block BLK, which is a target to execute various operations such as a write operation and a read operation. The row decoder module 36 can transfer the voltage supplied from the voltage generation circuit 35 to the selected block BLK.

The sense amplifier module 37 receives the column address from the address register 32b and decodes the received column address. Based on the result of the decoding, the sense amplifier module 37 executes a transmission operation of the data DAT between the memory controller 2 and the memory cell array 38 as follows. That is, the sense amplifier module 37 senses the threshold voltage of the memory cell transistor MT described later in the memory cell array 38 to generate read data DAT, and the generated read data DAT is output to the memory controller 2 via the input and output circuit 31. Further, the sense amplifier module 37 receives the write data DAT from the memory controller 2 via the input and output circuit 31, and transmits the received write data DAT to the memory cell array 38.

The memory cell array 38 includes blocks BLK0 to BLKm (m is an integer of 1 or more). For example, each of the blocks BLK0 to BLKm is a data erasing unit. As shown in FIG. 3, the block BLK includes a plurality of memory cell transistors MT associated with the bit line BL and the word line WL, and includes, for example, four string units SU0 to SU3. In the present embodiment, the plurality of memory cell transistors MT are examples of storage elements. Each string unit SU includes a plurality of NAND strings NS. Each NAND string NS is associated with the corresponding bit line BL among the bit lines BL0 to BLk (k is an integer of 1 or more), and includes, for example, memory cell transistors MT0 to MT7 and select transistors ST1 and ST2. Each memory cell transistor MT includes a control gate and a charge storage layer, and stores data in a non-volatile manner. Each of the select transistors ST1 and ST2 is used to select the NAND string NS including the select transistors ST1 and ST2 during various operations.

The drain of the select transistor ST1 of each NAND string NS is connected to the corresponding bit line BL described above. The memory cell transistors MT0 to MT7 are connected between the source of the select transistor ST1 and the drain of the select transistor ST2. The source of the select transistor ST2 is connected to the source line SL.

The control gates of the memory cell transistors MTj of a plurality of NAND strings NS provided in the same block BLK are commonly connected to the word line WLj. Here, in the example of FIG. 3, j is any integer from 0 to 7. The gates (control gates) of the select transistors ST1 of the plurality of NAND strings NS provided in the same string unit SUi are commonly connected to the select gate line SGDi. Here, i is any integer from 0 to 3. The gates of the select transistors ST2 of a plurality of NAND strings NS provided in the same block BLK are commonly connected to the select gate line SGS.

Each bit line BL is commonly connected to the drain of the select transistor ST1 of the corresponding NAND string NS provided in each string unit SU. The source line SL is shared among a plurality of string units SU.

The block BLK includes a plurality of pages P0 to Pn (n is an integer of 1 or more), and each page P includes a plurality of memory cell transistors MT commonly connected to the same word line WL. The page P is used, for example, as a data writing unit and a data reading unit. A plurality of memory cell transistors MT commonly connected to one word line WL may be used as a data writing unit and a data reading unit.

Although the circuit configuration of the memory cell array 38 has been described above, the circuit configuration of the memory cell array 38 is not limited to the above. For example, the number of string units SU provided in each block BLK may be changed to any number. Further, each of the memory cell transistors MT and the select transistors ST1 and ST2 provided in each NAND string NS may be changed to any number. Each of the number of word lines WL and select gate lines SGD and SGS is changed based on the number of memory cell transistors MT and select transistors ST1 and ST2 in the NAND string NS.

(Operation Method) The memory system 1 may use, for example, several operation methods. For example, the memory system 1 may use an SLC (Single-Level Cell) method, an MLC (Multi-Level Cell) method, a TLC (Triple-Level Cell) method, or a QLC (Quadruple-Level Cell) method. The SLC method, the MLC method, the TLC method, and the QLC method are operation methods for storing 1-bit data, 2-bit data, 3-bit data, and 4-bit data in one memory cell transistor MT, respectively. An operation method having a large number of bits that can be stored in one memory cell transistor MT has a large storage capacity, and an operation method having a small number of bits that can be stored has a high operation speed.

Figure 4:
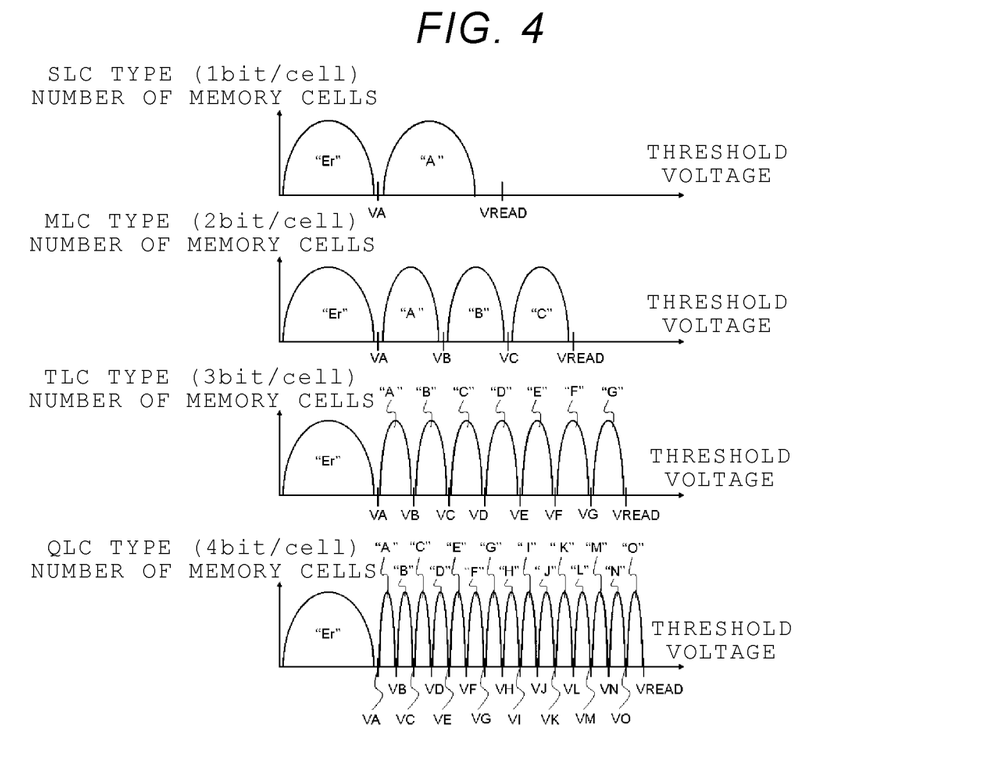
FIG. 4 is a schematic diagram for illustrating the threshold voltage distribution of the memory cell array according to the first embodiment.

The operation method in the first embodiment will be described with reference to FIG. 4. FIG. 4 is a schematic diagram for illustrating the threshold voltage distribution of the memory cell array 38 according to the first embodiment and shows four types of threshold voltage distributions in which the SLC method, the MLC method, the TLC method, and the QLC method are used, respectively, and the group of read voltages. In the threshold voltage distribution shown in FIG. 4, the vertical axis corresponds to the number of memory cell transistors MT (the number of memory cells), and the horizontal axis corresponds to the threshold voltage Vth of the memory cell transistors MT. As shown in FIG. 4, the plurality of memory cell transistors MT form a plurality of threshold voltage distributions according to the applied operation method, that is, the number of bits of data to be stored or read.

When the SLC method (1 bit/cell) is used, the threshold voltages of the plurality of memory cell transistors MT form two threshold voltage distributions. These two threshold voltage distributions are referred to as "Er" state and "A" state, respectively, in order from the lowest threshold voltage, for example. In the SLC method, 1-bit data items different from each other are assigned to the respective threshold voltage distributions in the "Er" state and the "A" state.

When the MLC method (2 bits/cell) is used, the threshold voltages of the plurality of memory cell transistors MT form four threshold voltage distributions. These four threshold voltage distributions are referred to as "Er" state, state, state, and "C" state, other are assigned to the respective threshold voltage distributions in the "Er" state to the "C" state.

When the TLC method (3 bits/cell) is used, the threshold voltages of the plurality of memory cell transistors MT form eight threshold voltage distributions. These eight threshold voltage distributions are referred to as, for example, in order from the lowest threshold voltage, "Er" state, "A" state, "B" state, "C" state, "D" state, "E" state, "F" state, and "G" state, respectively. In the TLC method, 3-bit data items different from each other are assigned to the respective threshold voltage distributions in the "Er" state to the "G" state.

When the QLC method (4 bits/cell) is used, the threshold voltages of the plurality of memory cell transistors MT form 16 threshold voltage distributions. The 16 threshold voltage distributions are referred to as, for example, in order from the lowest threshold voltage, "Er" state, "A" state, "B" state, "C" state, "D" state, "E" state, "F" state, "G" state, "H" state, "I" state, "J" state, "K" state, "L" state, "M" state, state, and "0" state, respectively. In the QLC method, 4-bit data items different from each other are assigned to the respective threshold voltage distributions in the "Er" state to the "0" state.

In various writing methods, the read voltage can be set between adjacent threshold voltage distributions. Specifically, the read voltage VA can be set between the maximum threshold voltage in the "Er" state and the minimum threshold voltage in the "A" state. Similarly, the read voltage VB can be set between the "A" state and the "B" state. The read voltage VC can be set between the "B" state and the "C" state. The read voltage VD can be set between the "C" state and the "D" state. The read voltage VE can be set between the "D" state and the "E" state. The read voltage VF can be set between the "E" state and the "F" state. The read voltage VG can be set between the "F" state and the "G" state. The read voltage VH can be set between the "G" state and the "H" state. The read voltage VI can be set between the "H" state and the "I" state. The read voltage VJ can be set between the "I" state and the "J" state. The read voltage VK can be set between the "J" state and the "K" state. The read voltage VL can be set between the "K" state and the "L" state. The read voltage VM can be set between the "L" state and the "M" state. The read voltage VN can be set between the "M" state and the "N" state. The read voltage VO can be set between the "N" state and the "O" state.

In various writing methods, the read path voltage VREAD can be set to a voltage higher than the maximum threshold voltage in the highest threshold voltage distribution. The memory cell transistor MT in which the read path voltage VREAD is applied to the gate is turned on regardless of the data to be stored.

The number of bits of data to be written or read to and from one memory cell transistor MT described above is an example and is not limited thereto. For example, data of 5 bits or more may be stored in the memory cell transistor MT. Further, the read voltage and the read pass voltage may be set to the same voltage value or different voltage values in each operation method. Although the case where the threshold voltage distributions do not overlap has been described in FIG. 4, in reality, the threshold voltage distributions vary due to various factors and may overlap each other.

Figure 5:
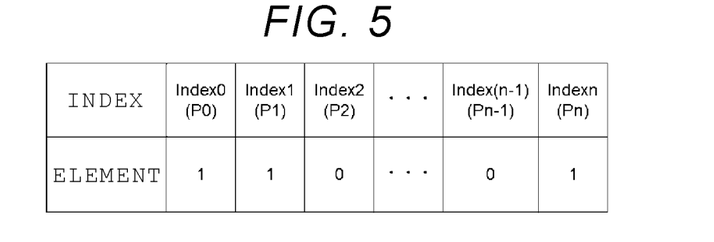
FIG. 5 is a diagram showing a management table for selecting an operation method in the memory system according to the first embodiment.
Figure 6:
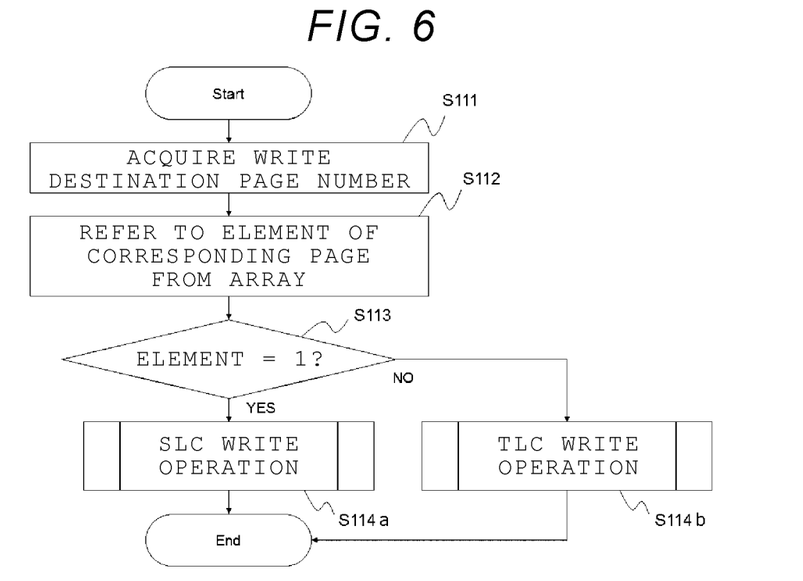
FIG. 6 is a flowchart for illustrating a write operation issued to the non-volatile memory in the memory system according to the first embodiment.
Figure 7:
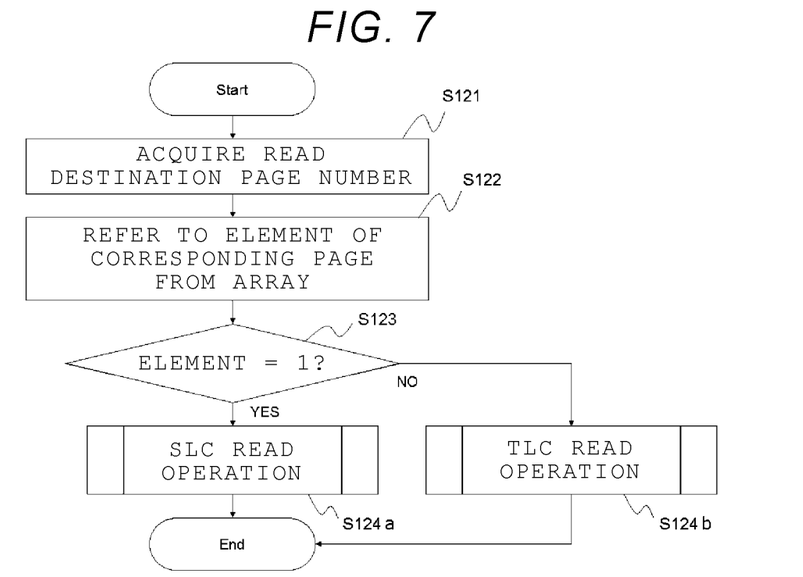
FIG. 7 is a flowchart for illustrating a read operation issued to the non-volatile memory in the memory system according to the first embodiment.

(Operation) Next, the operation of the memory system 1 will be described with reference to FIGS. 5 to 7. FIG. 5 is a diagram showing a management table for selecting an operation method in the memory system according to the first embodiment. FIG. 6 is a flowchart for illustrating a write operation issued to the non-volatile memory in the memory system according to the first embodiment, and FIG. 7 is a flowchart for illustrating a read operation issued to the non-volatile memory in the memory system according to the first embodiment.

As shown in FIG. 5, the management table is a table showing the correspondence between page numbers and elements. In the present embodiment, the management table is stored in the non-volatile memory 3. The management table can store elements for the number of pages P for one block BLK of the non-volatile memory 3. The index of the management table corresponds to the number of each page P, and each element of the management table is set based on the write operation speed for each page P of a certain block BLK, which is measured in advance before the shipment of the memory system 1. If the write operation speed for the page P is slower than a first speed (described below), a first value is set for the element corresponding to the page P, and if the write operation speed for the page P is equal to or higher than the first speed, a second value is set for the element corresponding to the page P. Specifically, for example, the average write operation speed of the block BLK is set as the first speed, the element of page P whose write operation speed is slower than the average write operation speed is set to 1, and the element of page P whose write operation speed is equal to or higher than the average write operation speed is set to 0. In the present embodiment, the write operation speed is measured in advance before the shipment of the memory system 1, but the measurement timing is not limited thereto. When designing the memory system 1, the write operation speed for each page P of a certain block BLK may be measured and each element of the management table may be set based on the result of the write operation speed. Further, the write operation speed of each page P in the block BLK is due to a physical structure such as the first word line WL0 of the string unit SU3 and the last word line WL7 of the string unit SU0 located at a relatively end of the block BLK, and the entire blocks BLK may have a similar tendency. Therefore, in the present embodiment, the writing speed of each page P for one block BLK is representatively measured, and the same management table is applied to the page P of all other blocks BLK to make the capacity of the management table stored in the non-volatile memory 3 small, but measurements may be performed on a plurality of blocks BLK.

When performing an operation, the element corresponding to the write operation target page is referred to, and if the element is 1, the first operation method is selected, and if the element is 0, the second operation method is selected. In the present embodiment, the first operation method will be described as the SLC method and the second operation method will be described as the TLC method, but the method may be used properly according to the stored data and is not limited thereto. In the present embodiment, CPU 22 selects the operation method. In an alternative embodiment, the non-volatile memory 3 selects the operation method.

Specifically, the operation method selection and operation procedure will be described.

As shown in FIG. 6, in S111, the CPU 22 acquires the page P number of the write destination based on the write command received from the host device 4.

In S112, the CPU 22 reads the management table stored in the non-volatile memory 3 onto the RAM 23 and refers to the element corresponding to the page P number acquired in S111. The reading of the management table onto the RAM 23 may be performed during the initialization operation after the power is turned on, and does not have to be performed after receiving the write command from the host device 4.

If the element of the referenced page P number is 1 (S113; YES), the process proceeds to S114a and the sequencer 34 executes the write operation to the corresponding page P by the SLC method. On the other hand, if the element of the referenced page P number is 0 (S113; NO), the process proceeds to S114b and the sequencer 34 executes the write operation to the corresponding page P by the TLC method.

From the above, the operation method is selected and the write operation is performed.

Similarly, for the read operation, the read method is selected according to S121 to S124 shown in FIG. 7 and the read operation is performed.

In S121, the CPU 22 acquires the page P number of the read destination based on the read command received from the host device 4.

In S122, the CPU 22 reads the management table stored in the non-volatile memory 3 onto the RAM 23 and refers to the element corresponding to the page P number acquired in S111.

If the element of the referenced page P number is 1 (S123; YES), the process proceeds to S124a and the sequencer 34 executes the read operation from the corresponding page P by the SLC method. On the other hand, if the element of the referenced page P number is 0 (S123; NO), the process proceeds to S124b and the sequencer 34 executes the read operation from the corresponding page P by the TLC method.

From the above, the operation method is selected and the read operation is performed.

As described above, according to the present embodiment, by applying the operation method having a high operation speed to the page P having a slow write operation speed, the difference in the operation speed between the page P having a high write operation speed and the page P having a low write operation speed is reduced and it is possible to reduce variations in the write operation speed in the block BLK. Further, the average speed of the block BLK is expected to be improved by reducing the variation in the write operation speed. Further, for the page P having a relatively high write operation speed, a high storage capacity is made possible by using an operation method having a large storage capacity.

Further, in the non-volatile memory 3 constituting the memory system 1, there may be a performance index that defines the minimum guarantee of the transfer speed of the write operation and the read operation. In that case, near the time of shipment or at the time of designing, a test measuring the performance index is executed. In the test, for example, it is necessary to measure the write operation speed using some pages P of the block BLK, which is an erasing unit, and to achieve the specified transfer speed with the average speed of the block BLK. For example, when the memory system 1 is an SD® card, the speed class can be mentioned as a performance index. In the SD® card, some pages P of 4 MB in each block BLK of dozens of MB are used when carrying out the test measuring the speed class. Therefore, the measurement result depends on the write operation speed of some pages P in the selected block BLK. If the write operation speed of the selected page P does not meet the target specified speed, the non-volatile memory 3 itself cannot meet the required performance index. However, according to the present embodiment, since it is possible to reduce the variation in the operating speed between pages, it is possible to reduce the variation in the average speed depending on the selected page P. That is, in the selected page P, for example, when the write operation is performed by the TLC operation method and the write operation speed is slower than the specified target speed, the write operation is performed by using the SLC operation method, so that it is possible to meet the specified target speed. Therefore, it becomes easy to achieve the required performance index.

Figure 8:
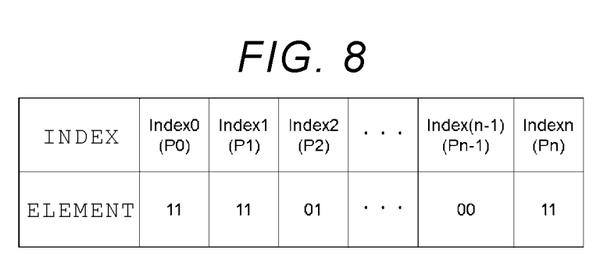
FIG. 8 is a diagram showing a management table for selecting an operation method in a memory system according to a second embodiment.

(Second Embodiment) The memory system 1 according to the second embodiment of the present disclosure will be described with reference to FIGS. 8 to 10. The same parts as those of the configuration and operation method of the first embodiment are designated by the same reference numerals, and the detailed description thereof will be omitted.

(Operation) The operation of the memory system 1 will be described with reference to FIGS. 8 to 10. FIG. 8 is a diagram showing a management table for selecting an operation method in the memory system according to the second embodiment and FIG. 9 is a flowchart for illustrating a write operation issued to the non-volatile memory in the memory system according to the second embodiment. FIG. 10 is a flowchart for illustrating a read operation issued to the non-volatile memory in the memory system according to the second embodiment.

If the write operation speed for the page P is slower than the second speed, which is slower than the first speed, a third value is set for the element corresponding to the page P. If the write operation speed for the page P is equal to or higher than the second speed and slower than the first speed, a first value is set for the element corresponding to the page P. If the write operation speed for the page P is faster than the first speed, a second value is set for the element corresponding to the page P. In the present embodiment, for example, the first value is 01, the second value is 00, and the third value is 11.

When performing the operation, the element corresponding to the write operation target page P is referred to. If the element is 01, a first operation method is selected, if the element is 00, a second operation method is selected, and if the element is 11, a third operation method is selected. In the present embodiment, the first operation method will be described as MLC, the second operation method will be described as TLC, and the third operation method will be described as SLC, but the method may be used properly according to the stored data and is not limited thereto.

Specifically, the procedure for selecting the operation method and the operation processing will be described.

Figure 9:
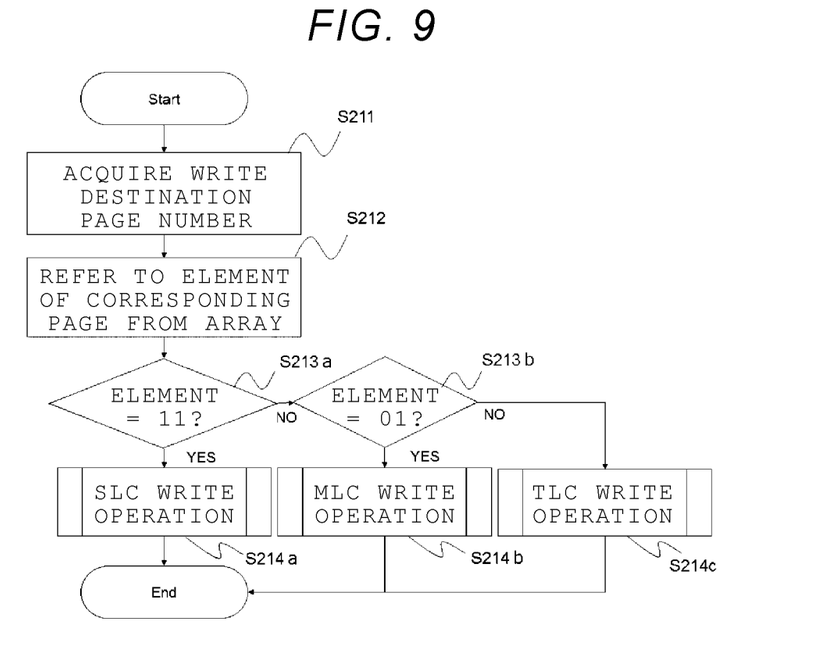
FIG. 9 is a flowchart for illustrating a write operation issued to a non-volatile memory in the memory system according to the second embodiment.

As shown in FIG. 9, in S211, the CPU 22 acquires the page P number of the write destination based on the write command received from the host device 4.

In S212, the CPU 22 reads the management table stored in the non-volatile memory 3 onto the RAM 23, and refers to the element corresponding to the page P number acquired in S211. The reading of the management table onto the RAM 23 may be performed during the initialization operation after the power is turned on, and does not have to be performed after receiving the write command from the host device 4.

If the element of the referenced page P number is 11 (S213a; YES), the process proceeds to S214a and the sequencer 34 executes the write operation to the corresponding page P by the SLC method. On the other hand, if the element of the referenced page P number is not 11 (S213a; NO), the process proceeds to S213b.

If the element of the referenced page P number is 01 (S213b; YES), the process proceeds to S214b, and the sequencer 34 executes the write operation to the corresponding page P by the MLC method. On the other hand, if the element of the referenced page number is not 01 (S213b; NO), the process proceeds to S214c and the sequencer 34 executes a write operation to the corresponding page P by the TLC method.

From the above, the writing method is selected and the write operation is performed.

Figure 10:
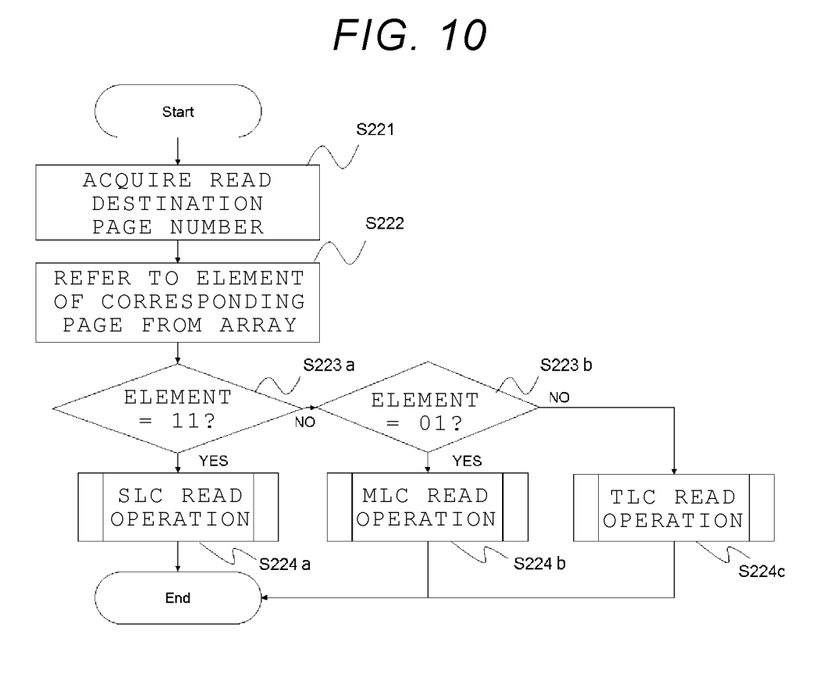
FIG. 10 is a flowchart for illustrating a read operation issued to the non-volatile memory in the memory system according to the second embodiment.

Similarly, for the read operation, the read method is selected according to S221 to S224 shown in FIG. 10, and the read operation is performed.

In S221, the CPU 22 acquires the page P number of the read destination based on the read command received from the host device 4.

In S222, the CPU 22 reads the management table stored in the non-volatile memory 3 onto the RAM 23 and refers to the element corresponding to the page P number acquired in S221. The reading of the management table onto the RAM 23 may be performed during the initialization operation after the power is turned on, and does not have to be performed after receiving the write command from the host device 4.

If the element of the referenced page P number is 11 (S223a; YES), the process proceeds to S224a and the sequencer 34 executes a read operation from the corresponding page P by the SLC method. On the other hand, if the element of the referenced page P number is not 11 (S223a; NO), the process proceeds to S223b.

If the element of the referenced page P number is 01 (S223b; YES), the process proceeds to S224b and the sequencer 34 executes the read operation from the corresponding page P by the MLC method. On the other hand, if the element of the referenced page P number is not 01 (S223b; NO), the process proceeds to S224c and the sequencer 34 executes a read operation from the corresponding page P by the TLC method.

From the above, the read method is selected and the read operation is performed.

As described above, according to the present embodiment, by classifying the operating speeds in more detail and selecting the corresponding operation methods, it is possible to achieve a high storage capacity with a variation in the operation speeds less than that in the memory system 1 of the first embodiment. Further, as in the first embodiment, it is facilitated to achieve the required performance index.

According to the memory system of at least one embodiment described above, by selecting the operation method for each page based on the operation speed of each page measured in advance, the variation in the operation speed can be reduced and the storage capacity can be secured, and it is facilitated to achieve the required performance index.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory; and
a memory controller, wherein
the non-volatile memory includes a memory cell array having first and second pages each including a plurality of storage elements, and
the memory system is configured to execute one of at least a first operation method for storing n-bit (n is a natural number) data per storage element and a second operation method for storing m-bit (m is a natural number satisfying m>n) data per storage element, and includes a control information storage unit in which a first value is set for the first page having a pre-determined write operation speed that is slower than a first speed, and a second value is set for the second page having a pre-determined write operation speed that is equal to or higher than the first speed, and
the memory system is configured to, at the time of a write operation, select one of the at least first and second operation methods for writing to a page in accordance with a value set in the control information storage unit for the page and perform the write operation using the selected operation method, wherein the first operation method is selected for the first page having the first value set in the control information storage unit and the write operation is performed on the first page using the first operation method, and the second operation method is selected for the second page having the second value set in the control information storage unit and the write operation is performed on the second page using the second operation method,
wherein the pre-determined write operation speed for each of the first and second pages is determined during a test of measuring a performance index of the memory system executed near the time of a shipment of the memory system or at the time of designing the memory system, and
a difference between a write operation speed during execution of the write operation in the first page using the first operation method and a write operation speed during execution of the write operation in the second page using the second operation method is smaller than a difference between the pre-determined write operation speed of the first page and the pre-determined write operation speed of the second page.

2. The memory system according to claim 1, wherein the memory system is further configured to:
at the time of a read operation, select a first read method for the first page having the first value set in the control information storage unit and perform the read operation using the first read method, and select a second read method for the second page having the second value set in the control information storage unit and perform the read operation using the second read method.

3. The memory system according to claim 1, wherein the memory cell array further has a third page including a plurality of storage elements, and the memory system is further configured to:
execute one of at least the first operation method, the second operation method, and a third operation method for storing I-bit (I is a natural number satisfying m>n>I) data in the storage elements, and at the time of the write operation, select the third operation method for the third page having a pre-determined write operation speed that is slower than a second speed, which is slower than the first speed, and perform the write operation using the third operation method.

4. The memory system according to claim 3, wherein the memory system is further configured to:
at the time of a read operation, select a third read method for the third page having the pre-determined write operation speed that is slower than the second speed and perform the read operation using the third read method.

5. The memory system according to claim 3, wherein a difference between a write operation speed in the third page using the third operation method and the write operation speed in the second page using the second operation method is smaller than a difference between the pre-determined write operation speed of the third page and the pre-determined write operation speed of the second page.

6. The memory system according to claim 1, wherein the memory system is configured to read from and write to the memory cell array in units of pages, and to perform an erase operation on the memory cell array in units of blocks, each block containing a plurality of pages.

7. A method of operating a memory system, the memory system including
a non-volatile memory including a memory cell array having a plurality of blocks, each block having a plurality of pages including a first page and a second page, each of the pages including a plurality of storage elements, and
a control information storage unit in which a first value is set for the first page having a pre-determined write operation speed that is slower than a first speed, and a second value is set for the second page having a pre-determined write operation speed that is equal to or higher than the first speed,
said method comprising:
selecting one of at least a first operation method and a second operation method for writing to a page in accordance with a value set in the control information storage unit for the page and performing a write operation using the selected operation method, wherein n-bit (n is a natural number) data is stored per storage element when the first operation method is used and m-bit (m is a natural number satisfying m>n) data is stored per storage element when the second operation method is used, wherein
the first page having the first value set in the control information storage unit is written to using the first operation method, and
the second page having the second value set in the control information storage unit is written to using the second operation method,
wherein the pre-determined write operation speed for each of the first and second pages is determined during a test of measuring a performance index of the memory system executed near the time of a shipment of the memory system or at the time of designing the memory system, and
a difference between a write operation speed during execution of the write operation in the first page using the first operation method and a write operation speed during execution of the write operation in the second page using the second operation method is smaller than a difference between the pre-determined write operation speed of the first page and the pre-determined write operation speed of the second page.

8. The method according to claim 7, further comprising:
reading from the first page having the first value set in the control information storage unit using a first read method; and
reading from the second page having the second value set in the control information storage unit using a second read method.

9. The method according to claim 7, wherein the plurality of pages of each block further includes a third page, said method further comprising:
writing to the third page having a pre-determined write operation speed that is slower than a second speed, which is slower than the first speed, using a third operation method for storing I-bit (I is a natural number satisfying m>n>I) data in each of the plurality of storage elements.

10. The method according to claim 9, further comprising:
reading from the third page having the pre-determined write operation speed that is slower than the second speed using a third read method.

11. The method according to claim 9, wherein a difference between a write operation speed in the third page using the third operation method and the write operation speed in the second page using the second operation method is smaller than a difference between the pre-determined write operation speed of the third page and the pre-determined write operation speed of the second page.

12. The method according to claim 7, wherein a read operation and a write operation on the memory cell array are performed in units of pages, and an erase operation on the memory cell array is performed in units of blocks.

13. A method of configuring a memory system that comprises a non-volatile memory including a memory cell array having a plurality of blocks, each block having a plurality of pages including a first page and a second page, each of the pages including a plurality of storage elements, said method comprising:
setting a first value in a control information storage unit for the first page having a pre-determined write operation speed that is slower than a first speed; and
setting a second value in the control information storage unit for the second page having a pre-determined write operation speed that is equal to or higher than the first speed, wherein
during a write operation, one of at least a first operation method and a second operation method is selected for writing to a page in accordance with a value set in the control information storage unit for the page and the write operation is performed using the selected operation method, wherein n-bit (n is a natural number) data is stored per storage element when the first operation method is used and m-bit (m is a natural number satisfying m>n) data is stored per storage element when the second operation method is used, wherein
the first page having the first value set in the control information storage unit is written to using the first operation method, and the second page having the second value set in the control information storage unit is written to using the second operation method, and
wherein the pre-determined write operation speed for each of the first and second pages is determined during a test of measuring a performance index of the memory system executed near the time of a shipment of the memory system or at the time of designing the memory system, and
a difference between a write operation speed during execution of the write operation in the first page using the first operation method and a write operation speed during execution of the write operation in the second page using the second operation method is smaller than a difference between the pre-determined write operation speed of the first page and the pre-determined write operation speed of the second page.

14. The method according to claim 13, wherein
during a read operation, the first page having the first value set in the control information storage unit is read using a first read method, and the second page having the second value set in the control information storage unit is read using a second read method.

15. The method according to claim 13, wherein
the plurality of pages of each block further includes a third page, and
during the write operation, the third page having a pre-determined write operation speed that is slower than a second speed, which is slower than the first speed, is written using a third operation method for storing I-bit (I is a natural number satisfying m>n>I) data in each of the plurality of storage elements.

16. The method according to claim 15, wherein
during a read operation, the third page having the pre-determined write operation speed that is slower than the second speed is read using a third read method.

17. The method according to claim 15, wherein a difference between a write operation speed in the third page using the third operation method and the write operation speed in the second page using the second operation method is smaller than a difference between the pre-determined write operation speed of the third page and the pre-determined write operation speed of the second page.

18. The method according to claim 13, wherein a read operation and a write operation on the memory cell array are performed in units of pages, and an erase operation on the memory cell array is performed in units of blocks.

* * * * *